United States Patent
Jin et al.

(10) Patent No.: US 6,879,187 B2
(45) Date of Patent: *Apr. 12, 2005

(54) SIGNAL DETECT CIRCUIT FOR HIGH SPEED DATA RECEIVERS

(75) Inventors: Robert X. Jin, San Jose, CA (US); Kathy L. Peng, Union City, CA (US); Stephen F. Dreyer, Los Altos, CA (US)

(73) Assignee: Intel Corporation, Santa Clara, CA (US)

(*) Notice: Subject to any disclaimer, the term of this patent is extended or adjusted under 35 U.S.C. 154(b) by 10 days.

This patent is subject to a terminal disclaimer.

(21) Appl. No.: 10/609,802

(22) Filed: Jun. 30, 2003

(65) Prior Publication Data

US 2004/0090247 A1 May 13, 2004

Related U.S. Application Data

(63) Continuation of application No. 10/171,071, filed on Jun. 13, 2002, now Pat. No. 6,614,271.

(51) Int. Cl.$^7$ ............... H03K 5/153; H03K 5/22
(52) U.S. Cl. ............... 327/77; 327/78
(58) Field of Search ............... 327/65, 74, 76, 327/77, 78, 79, 80, 88, 89

(56) References Cited

U.S. PATENT DOCUMENTS 6,060,890 A * 5/2000 Tsinker .................. 324/676

* cited by examiner

Primary Examiner—Tuan T. Lam
(74) Attorney, Agent, or Firm—Trop, Pruner & Hu, P.C.

(57) ABSTRACT

In accordance with one embodiment of the present invention, a signal detect circuit may analyze an input signal before passing it on to a receiver. The analysis may be done outside of the data path to avoid affecting the data path speed or adding distortion or jitter. The positive and negative thresholds of the data may be checked to see if the numbers of positive and negative crossings are comparable. Random and bursty noise can be detected since such noise normally does not have comparable positive and negative crossings.

5 Claims, 3 Drawing Sheets

SIGNAL DETECT CIRCUIT FOR HIGH SPEED DATA RECEIVERS

This is a continuation of prior application Ser. No. 10/171,071, filed Jun. 13, 2002, now U.S. Pat. No. 6,614,271.

BACKGROUND

This invention relates generally to receivers including signal detect circuits.

When high speed data signals are transmitted over a given media (wire, fiber optics, traces, etc.), the data signals may be degraded by noise and crosstalk picked up along the path between receiver and transmitter. At the receiver end, it is sometimes useful to know whether the input data signal is valid or fatally degraded by noise or crosstalk. As such, data receivers sometimes have a signal detect function to detect whether the input signal is valid.

One way to implement the signal detect function is to look for coding errors in the data stream. If the error rate exceeds a predetermined amount, then the signal is determined to be invalid. This method works well when the coding algorithm can reliably detect very low bit error rates, and the noise corrupting the data causes errors that violate the coding rules for the channel, i.e., the noise is from a source that is not the same as the data being monitored.

One limitation of this method is that it cannot detect crosstalk from an adjacent data channel with the same type of coding. This limitation arises because the interfering crosstalk signal may produce enough noise that meets all the coding requirements of the channel being monitored so that the error detector cannot discern between a valid signal and the crosstalk signal.

Another method used for the signal detect function is to compare the input signal amplitude against a preset threshold. If the input signal amplitude exceeds the preset threshold, then the signal is considered valid. This method is able to reject data transitions due to crosstalk and noise provided the crosstalk and noise amplitude is less than the threshold amplitude.

One limitation of this method is that doing the threshold comparison in the signal path causes duty cycle distortion at the output of the comparator, introducing jitter onto the data signal. A second limitation of this method is that if the interfering noise or crosstalk is greater than the threshold amplitude, this method will indicate that the signal is valid when it actually is invalid. A third limitation with this method is that introducing a threshold comparison in a data path typically degrades the speed of the input comparator, which may pose problems in high speed circuits.

A third method used for signal detect is to do a peak detect on the input signal, integrate it over a long period, and compare it to a preset threshold. One limitation of this method is that if the interfering noise or crosstalk is greater than the threshold amplitude, this method will indicate that the signal is valid when it actually is invalid.

Thus, there is a need for ways of implementing the signal detect function that overcomes one or more problems associated with existing methods.

DETAILED DESCRIPTION

Figure 1:
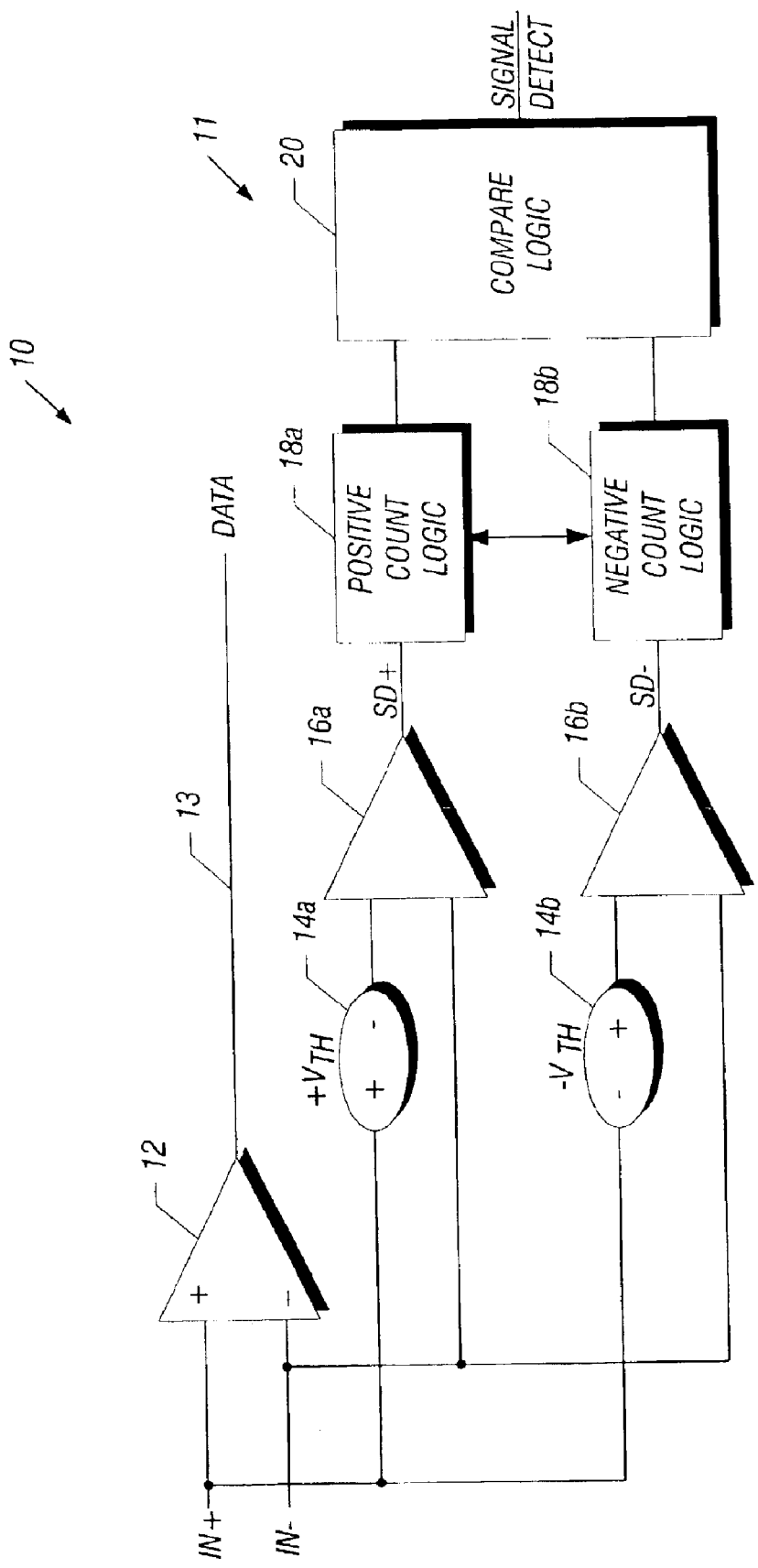
FIG. 1 is a schematic depiction of one embodiment of the present invention.

Referring to FIG. 1, receiver 10 includes a signal detect circuit 11 with two comparators 16 that are not placed in the data path 13 of the input data IN+, IN− to the input comparator 12. The comparator 16a trips when the input signal (IN+) exceeds a positive threshold provided by a threshold voltage source 14a. The comparator 16b trips when the input signal (IN−) exceeds a negative threshold determined by a threshold voltage source 14b.

The output of each comparator 16 goes to the count logic 18. The positive count logic 18a increments once when the input signal (SD+) exceeds a positive threshold. The negative count logic 18b increments once when the input signal (SD−) exceeds the negative threshold. The increments for both positive and negative count logic 18 is shown in FIG. 2.

The counts of the positive and negative count logic 18a, 18b are compared after a very long time by the compare logic 20. If the positive and negative counts are relatively close and less than a specified difference, then the signal is considered valid. If not, then the signal is invalid.

Figure 2:
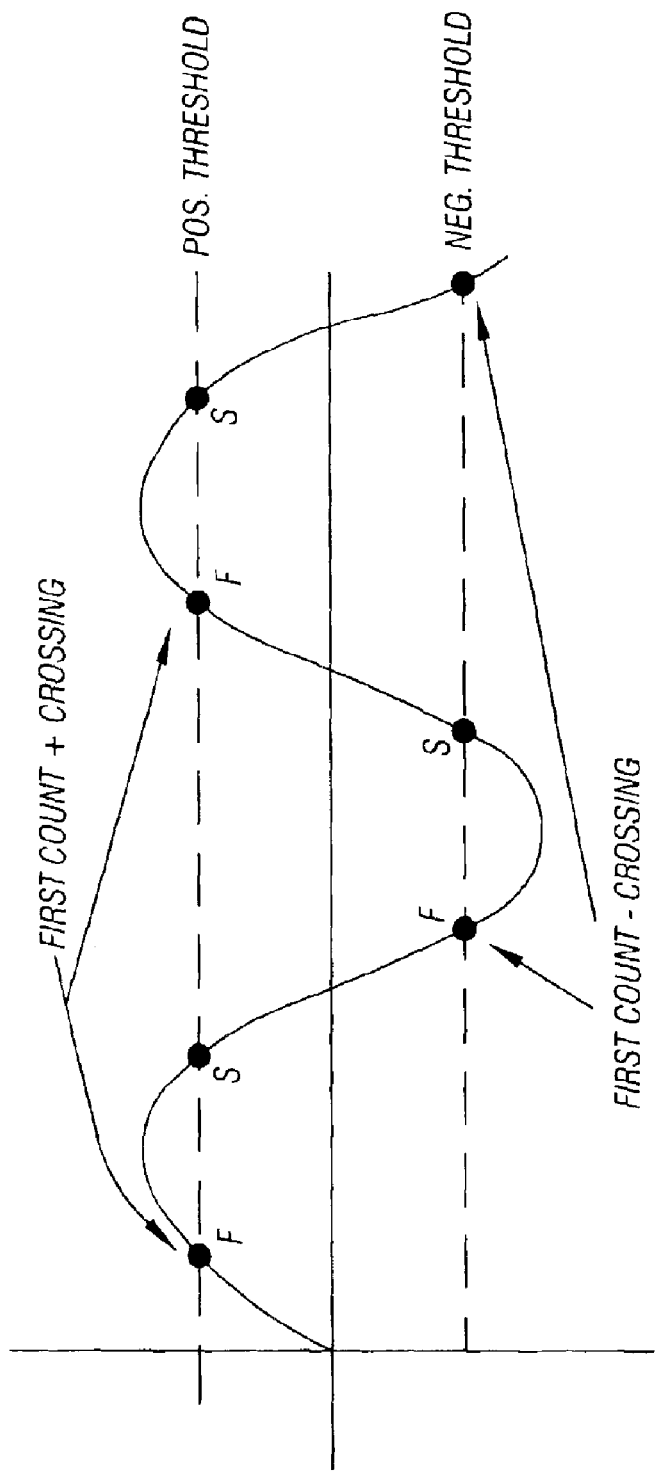
FIG. 2 is a hypothetical waveform in accordance with one-embodiment of the present invention.
Figure 3:
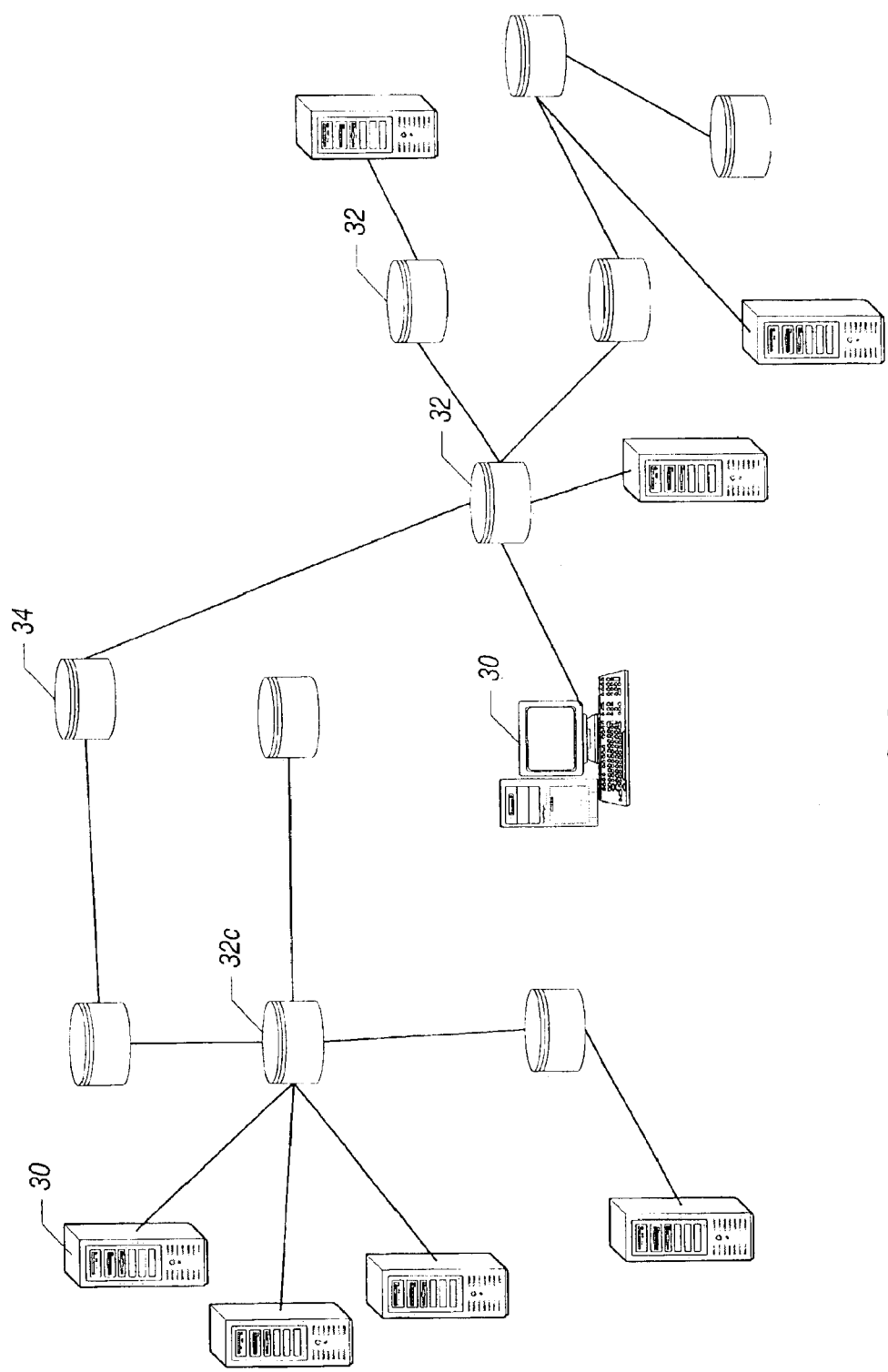
FIG. 3 is an illustration of an Ethernet network using the embodiment of the present invention illustrated in FIG. 1.

The first positive threshold ("F") is counted and not the second threshold as ("S") as indicated in FIG. 2 in some embodiments. This reduces the effect of noise that may cause multiple triggers and thus many spurious counts, affecting the quality of the signal detect function.

Since the signal detect circuit 11 is not in the data path 13 of the receiver 10 in some embodiments, the circuit 11 does not affect the data path speed or add any distortion or jitter. Because the signal detect circuit 11 counts the positive and negative threshold crossings and compares them to see if the number of crossings are approximately the same in some embodiments, random and bursty noise can be detected since such noise usually does not have equal positive and negative transitions.

If the transition density of the data is known, the counts from the positive and negative count logic can be checked to see if the counts meet the transition density range that the data should be in. If not, then the inputs to the receiver are noise, not data, and the signal is not valid.

Another modification is to compare the counts from a zero crossing data comparator against the counts from the threshold comparators 14. If the counts match, then the signal is valid. If not, then the signal is noise or crosstalk.

The present invention is applicable to a wide variety of high speed data technologies. One exemplary technology is Ethernet. See IEEE.802.3 CSMA/CD (ETHERNET) Standard No. 802.3-2001. Metropolitan area networks, local area networks, and storage area networks, based on 10 gigabit Ethernet technology are well known to those skilled in the art. Ethernet networks are one application for a single detect circuit shown in FIG. 1.

In many cases, it is desirable for receivers to have a signal detect function to detect whether an input signal received is valid. Thus, receivers 30 may be coupled by hubs 32. The hubs 32a and 32b may be coupled as an enterprise local area network. The hubs 32c may be coupled as a metropolitan area network edge. The hubs 32d may be coupled as a metropolitan area network core. Likewise, the hubs 32 maybe coupled through hubs 34 to form storage area networks and wide area networks. In wide area networks, Internet service providers and network service providers may create very high speed links at very low costs, between co-located, carrier class switches and routers and optical equipment that is directly attached to a synchronous optical network or synchronous digital hierarchy cloud. A ten gigabit Ethernet with a wide area network physical layer device may also allow construction of wide area networks that connect geographically dispersed local area networks between campuses or points of presence over existing networks. Ten gigabit Ethernet links between a service provider's switch and a dense wavelength division multiplexing device or line termination equipment might in fact be very short.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An Ethernet network comprising:

at least two signal receivers;

at least one of said signal receivers including a signal detect circuit including a positive threshold detector to determine whether an input signal has a positive voltage above a predetermined threshold;

a positive count logic to count the number of times that a positive threshold is exceeded;

a negative threshold detector to determine whether the input signal has a negative voltage below a predetermined threshold;

a negative count logic to determine the number of times the negative threshold is exceeded; and a comparator to compare the number of times that the input signal exceeds said positive and negative thresholds.

2. The device of claim 1 wherein said comparator determines whether the number of times that said positive threshold was exceeded is approximately the same as the number of times that said negative threshold was exceeded.

3. The device of claim 1 wherein said positive threshold detector includes a first input coupled to said input signal and the second input connected to a source of a positive threshold voltage.

4. The device of claim 1 wherein said positive count logic increments only the first time that a voltage pulse crosses a positive threshold voltage and not when the same pulse crosses said voltage again.

5. The device of claim 4 wherein said positive count logic increments once when the positive pulse exceeds the positive threshold voltage and does not increment again until a negative pulse exceeds a negative threshold voltage.

* * * * *